United States Patent

Henschen et al.

[15] 3,651,432

[45] Mar. 21, 1972

[54] IMPEDANCE MATCHED PRINTED CIRCUIT CONNECTORS

[72] Inventors: Homer Ernst Henschen, Carlisle; Emerson Marshall Reyner, II, Harrisburg, both of Pa.

[73] Assignee: AMP Incorporated, Harrisburg, Pa.

[22] Filed: Apr. 14, 1970

[21] Appl. No.: 28,485

[52] U.S. Cl. ............................333/33, 333/21 R, 333/84 M, 333/97 R

[51] Int. Cl. ......................H03h 7/38, H01p 3/08, H01p 5/08

[58] Field of Search ..................333/33, 21, 96, 97, 84, 84 M; 339/17; 317/101

[56] References Cited

UNITED STATES PATENTS

| | | | |
|---|---|---|---|
| 3,201,721 | 8/1965 | Voelcker | 333/33 |
| 3,268,795 | 8/1966 | Hudspeth et al. | 333/97 X |
| 3,483,489 | 12/1969 | Dietrich | 333/21 |
| 3,518,612 | 6/1970 | Dunman et al. | 333/84 X |
| 3,426,311 | 2/1969 | Gifford | 333/84 X |

*Primary Examiner*—Herman Karl Saalbach
*Assistant Examiner*—Marvin Nussbaum
*Attorney*—Curtis, Morris and Safford, Marshall M. Holcombe, William Hintze, William J. Keating, Frederick W. Raring, John R. Hopkins, Adrian J. La Rue and Jay L. Seitchik

[57] ABSTRACT

A unique means is disclosed for interconnecting and impedance matching microstrip circuits mounted on printed circuit boards using conventional printed circuit connectors. For coupling and matching a microstrip on one board to a microstrip on another board, the invention utilizes a printed circuit board with novel grounded conductive pads formed thereon. By grounding alternate connector contacts to the ground plane of one of the printed circuit boards and by connecting the conductive pads of the other board to the alternate grounded contacts of the connector, matching is accomplished. Similar matching means are used to match a coaxial line to a microstrip circuit mounted on a printed circuit board.

9 Claims, 5 Drawing Figures

TIME DOMAIN REFLECTOMETER PLOT FOR UNCOMPENSATED CONNECTION

—— 650 PICO SEC. RISE TIME
----- 350 PICO SEC. RISE TIME

TIME DOMAIN REFLECTOMETER PLOT FOR COMPENSATED CONNECTION

—— 650 PICO SEC. RISE TIME
----- 350 PICO SEC. RISE TIME

INVENTORS.
EMERSON M. REYNER, II
HOMER E. HENSCHEN

BY Sughrue, Rothwell, Mion, Zinn & Macpeak
ATTORNEYS.

*INVENTORS.*

EMERSON M. REYNER, II
HOMER E. HENSCHEN

BY Sughrue, Rothwell, Mion, Zinn & Macpeak

*ATTORNEYS.*

INVENTORS.
EMERSON M. REYNER, II
HOMER E. HENSCHEN

BY Sughrue, Rothwell, Mion, Zinn & Macpeak
ATTORNEYS.

IMPEDANCE MATCHED PRINTED CIRCUIT CONNECTORS

BACKGROUND OF THE INVENTION

1. Field of the Invention

The invention is in the field of impedance matching techniques for impedance matching one microstrip circuit mounted on a printed circuit board which is coupled to a second microstrip circuit mounted on another printed circuit board, and also to the matching of a microstrip circuit on a printed circuit board coupled to a coaxial cable.

2. Description of the Prior Art

Coaxial cables and microstrip circuits are used extensively in high speed computers, data processing equipment, video circuits, and communication equipment. Conventional printed circuit connectors have been used to connect two printed circuit boards or to connect a board with a cable where the effects of the reflections due to connector mismatch can be tolerated.

Mismatch can be attributed to the printed circuit boards themselves, the coaxial cable and its termination as well as the printed circuit connector coupling the boards or the board and the cable. Conventional connectors have contacts housed in plastic dielectrics which have dielectric constants different from that of the laminates from which microstrip circuits are made. This results in a mismatch when the connector is coupled to the circuit. With respect to the microstrips themselves, it has been found that they loose their characteristic impedance at the ends of the boards where they are plugged into the printed circuit connector, thus further increasing the mismatch. Since the preparation of the coaxial cable termination causes a change in the geometry and dielectric constant of the cable, they too effect the mismatch problem. Additionally, since coaxial cables frequently use air or foamed plastic dielectrics, which dielectrics are not acceptable for printed circuit housings, an additional mismatch problem is encountered.

The prior art has sought to remedy the mismatch problems encountered when printed circuit boards and coaxial cables are interconnected by developing special purpose connectors. However, such an approach to the problem has been found unsatisfactory. Production of these special purpose connectors requires the introduction of new and unfamiliar manufacturing techniques, which greatly increase the cost of the connector. Since it has been found that only a small percentage of the circuit applications require a low reflection coefficient, it was necessary to develop a means for compensating for mismatch using conventional printed circuit connectors without resorting to new and unfamiliar manufacturing techniques.

SUMMARY OF THE INVENTION

The deficiencies of the prior art have been overcome by the present invention which allows the use of conventional printed circuit connectors while accomplishing optimum matching between interconnected circuits.

The concern over impedance matching is due to energy reflection. When a signal passing along a line of one impedance encounters a section of line of a different impedance, there is a reflection of a percentage of the signal at the change of impedance. The amount of voltage reflection determines the reflection coefficient. The reflection coefficient is a decimal equivalent of the percentage of reflected voltage. These reflection coefficients will be used below to show the effect of the invention on interconnected circuits.

A signal traveling down a relatively long line of, for example, 75 ohms which encounters another line of, for example, 100 ohms, will be reflected as discussed above. The amount of reflection is a function of various properties of both the signal and the unmatched section of line. Specifically, the effect of the length of a mismatched section of line is determined by the frequency of the signal. If the length of the mismatch is less than one-half a wave length, the impedance of the mismatched length tends to be averaged with the line on each side.

In general, as frequencies increase, impedance matching becomes more important. The wave length in the air of a 60 cycle AC signal is many miles long so, obviously, impedance matching is not important for such a signal. However, as the frequency of the signal increases, the wave length decreases and thus impedance matching becomes more of a necessity. For example, the wave length of a 1 gigahertz signal is only about 2 inches in diallyl phthalate (a popular connector dielectric) and so impedance matching in the connector is extremely important. In general, it has been found that above the frequency of 100 megahertz, conventional printed circuit connectors become an appreciable part of the wave length and therefore impedance mismatch may surpass permissible limits. By using the teachings of this invention, standard conventional printed circuit connectors have been compensated to 500 megahertz, thereby greatly increasing the frequency range over which the connector can be used.

When the invention is applied to the interconnecting of two microstrip circuits mounted on different printed circuit boards, alternate contacts of the connector are electrically connected to the ground plane of one of the printed circuit boards. To the side of the other board carrying the signal conductors are attached conductive pads, one on each side of each of the signal conductors. These pads are electrically connected to the ground plane of this other board. When the board is mated with the connector, the pads contact the grounded connector contacts. The effect of the additional pads is to add to the connection the necessary capacitive impedance to compensate for the inductive impedance which results in the mismatch.

A better understanding of the invention may be had with reference to FIGS. 1 and 2, where FIG. 1 shows the effect of the impedance mismatch without the use of this invention while FIG. 2 shows the compensating effects realized when the teachings of this invention are utilized.

The graphs of FIGS. 1 and 2 were developed using the technique known as "time domain reflectometry." The technique provides for sending a fast rise time pulse along a line or a circuit and then looking at the reflection of the signal as it comes back. When measuring impedance, the technique produces a picture or graph representing the impedance of the line as it is averaged by the highest frequencies of the pulse along its length. Since the horizontal axis of the graph is distance along the line, it is possible to locate and identify the impedance of the elements of the line, such as lengths of cable, connectors and other electrical components. The vertical axis can be read as either impedance or as a reflection coefficient. In FIGS. 1 and 2, the ordinate to the left of the graph is calibrated in reflection coefficients, while the ordinate to the right is calibrated in ohms.

In the example to be cited the impedance characteristics were determined using the time domain reflectometry technique with a Hewlett-Packard 1415A Time Domain Reflectometer. As is known, the faster the rise time of the pulse introduced into the system, the greater is the measuring technique's ability to distinguish the elements along the line. A connector which looks good at a fast rise time is indeed good. However, a connector which looks good at a slow rise time may, or may not, be good at higher frequencies. A slow rise time hides or averages the impedance mismatches. For this reason, two plots were taken. The solid traces in FIGS. 1 and 2 were made using a pulse with a rise time of 650 pico seconds. This gives an indication of the performance to be expected up to a frequency of 500 megahertz. The dashed line plots were obtained using a pulse with a rise time of 350 pico seconds and will give an indication of the performance to be expected with frequencies up to one gigahertz.

As can be seen from FIG. 1, when two microstrip circuits are interconnected through a conventional printed circuit connector, the mismatch caused by the connector can be substantial. Specifically, in the example cited, without the use of the teachings of this invention, approximately 14 percent of the voltage is reflected by the connector.

Using any desired impedance, in this example 50 ohms, as the zero-reference, the area under the plot is proportional to the shunt capacitance or series inductance of the element. The area in the direction of increasing impedance or positive reflection coefficient indicates an excess series inductance while the area in the direction of lower impedance or negative reflection coefficient indicates an excess of shunt capacitance.

Since the graph of FIG. 1 indicates an uncompensated series inductance introduced by the connector, a means for compensating for this impedance must be developed. This is precisely what is done by the instant invention. That is, the invention compensates for this mismatched impedance without the use of a specially designed matching connector.

FIG. 2 shows the results of the use of the instant invention. The graph was obtained using the same printed circuit boards and the same connector. However, in this case alternate contacts of the connector were grounded to the ground plane of one board while the conductive pads of this invention were added to the signal conductor carrying side of the other board as has been described above. As can be easily seen from this graph, the effects of the connector mismatch have been almost totally compensated.

Similar results were obtained when a coaxial cable was coupled through a conventional printed circuit connector to a microstrip circuit on the printed circuit board. In this case, the printed circuit connector is mounted on the board with alternate contacts of the connector electrically connected to the board's ground plane through the use of conductive pads mounted on each side of each of the signal carrying conductors. The connector contact has an upper spring member connected to the signal conductor of the coaxial cable and a lower spring member connected to the coaxial cable braid. Alternate contacts of the printed circuit connector are connected to the coaxial braid and the coaxial contact body which is also used for strain relief. In this manner, the necessary impedance compensation is accomplished.

DETAILED DESCRIPTION OF THE PREFERRED EMBODIMENTS

Figure 3:
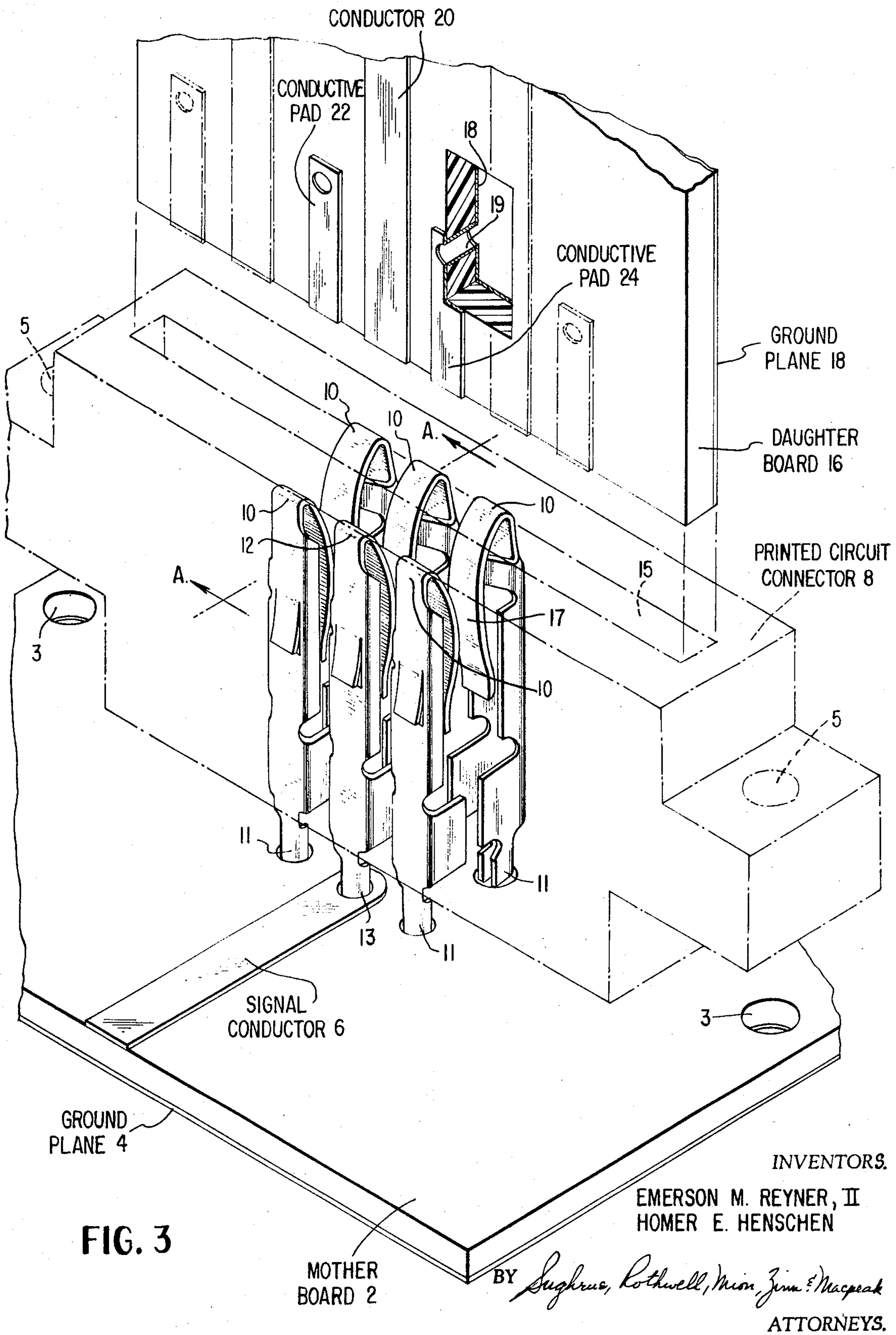
FIG. 3 shows a preferred embodiment of the invention, wherein one printed circuit board is coupled to another with a conventional printed circuit connector while obtaining optimum impedance matching.
Figure 4:
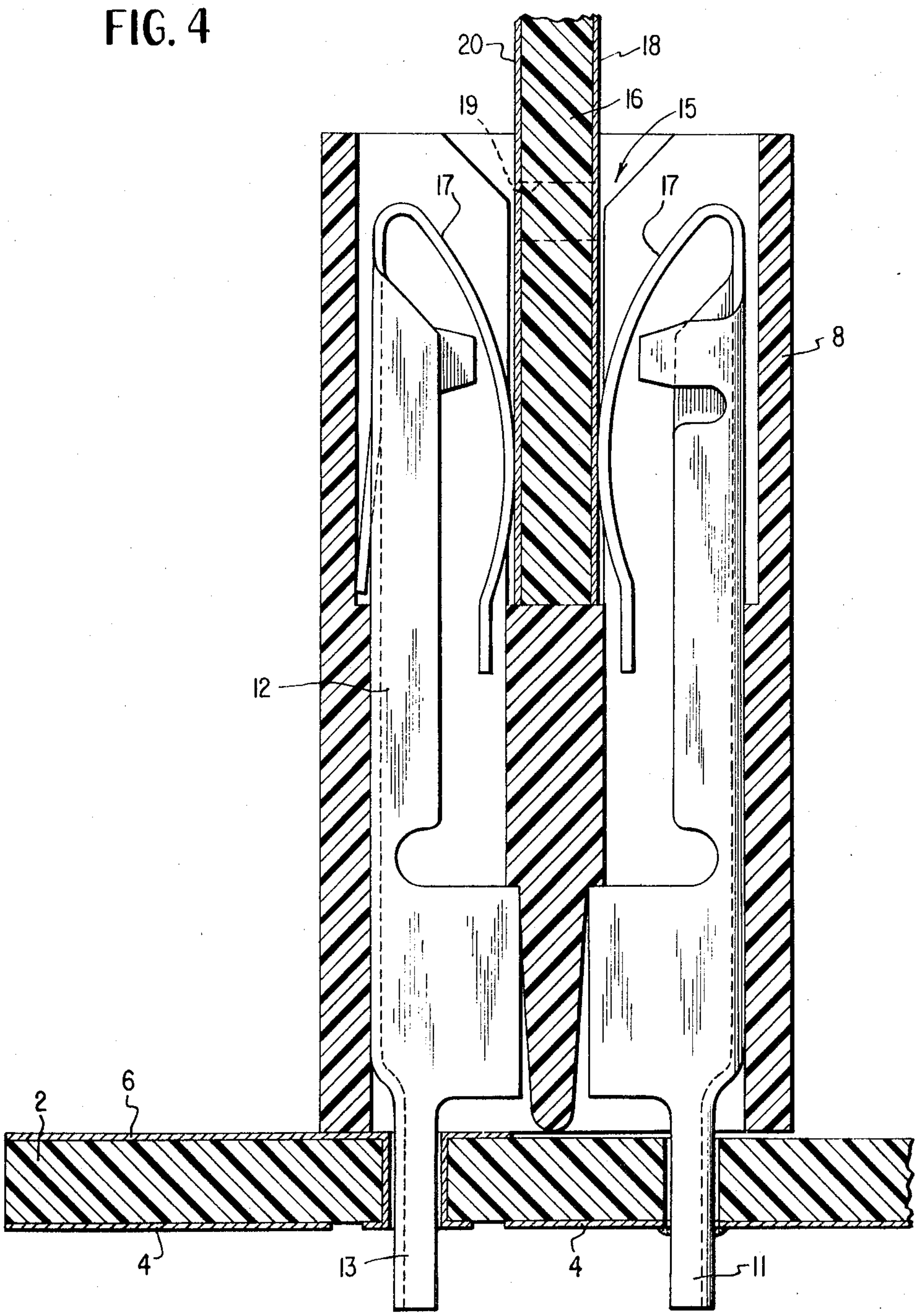
FIG. 4 shows section A—A of FIG. 3.

One embodiment of the invention used when connecting two printed circuit boards together through a printed circuit connector is shown in FIGS. 3 and 4. On one surface of the mother board 2 is mounted signal conductor 6 while, on the opposite side of the board is mounted the ground plane 4. Though only one signal conductor is shown in this embodiment, it is understood that a plurality of such conductors may be used. Conventional printed circuit connector 8 is mounted on the board 2 and secured thereto by means of fasteners (not shown) placed through holes 3 and 5. The connector consists of a block of dielectric into which is placed a plurality of contacts. In FIG. 3, six contacts designated 10 and 12 are shown. Contact 12 is distinguished from the others because it contacts the signal conductor 6. It is understood, however, that additional contacts may be used. A hollow 15 in the connector body accommodates the daughter board 16. Terminations 11 of contacts 10 pass through the board 2 and are caused to make electrical contact with the ground plane 4 by means of a solder connection. This connection is shown in FIG. 4. Termination 13 of contact 12 is similarly brought through the board 2. By extending the signal conductor 6 into the hole through which termination 13 passes, electrical contact is effected between the termination 13 and the signal conductor. With reference to FIG. 4, it is noted that a discontinuity of the ground plane is effected in the area of the brought-through signal conductor thus assuring isolation between the ground plane and the signal conductor. The opposite ends of the contacts 10 and 12 are terminated in spring members 17. These members accept the daughter board 16 which results in an electrical connection between the conductive members of board 16 and the conductive members of board 2. As additional contacts are added, alternate ones in the front row, that is, the row containing contact 12, are connected to additional signal conductors on the mother board 2 and daughter board 16 in the manner described for contact 12.

On one surface of daughter board 16 is mounted the ground plane 18 while, on its opposite surface is connected a signal conductor 20 with conductive pads 22 and 24 mounted on the sides thereof. Though only one signal conductor is shown and two conductive pads, it is understood that additional signal conductors and pads may be used on the board, laid out in an alternately spaced fashion as shown by the dotted conductors in FIG. 3. Conductive pads 22 and 24 are caused to be an electrical contact with the ground plane 18 by soldering these pads to the ground plane through holes 19.

By electrically connecting terminal ends 11 to the ground plane and using the conductive pads 22 and 24 electrically connected to the ground plane 18, the necessary additional capacitive impedance is added to the circuit, thereby effecting an optimum impedance match. Optimum matching between a variety of boards and the same connector can be accomplished simply by varying the configuration of the conductive pads.

Figure 1:
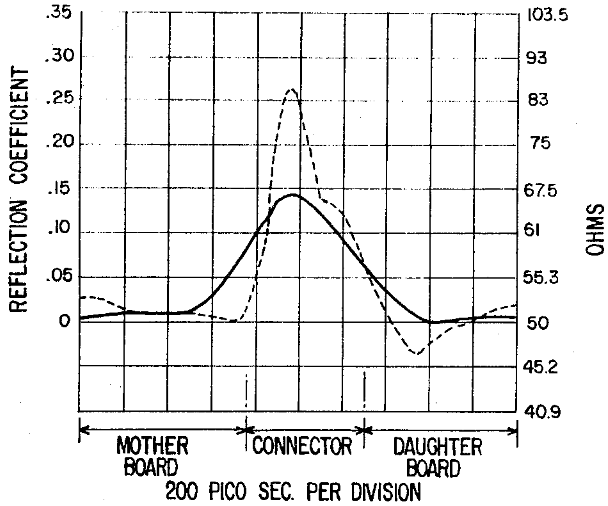
FIG. 1 is a time domain reflectometer plot for a printed circuit board to printed circuit board connection using a conventional printed circuit connector without using the teachings of this invention.
Figure 2:
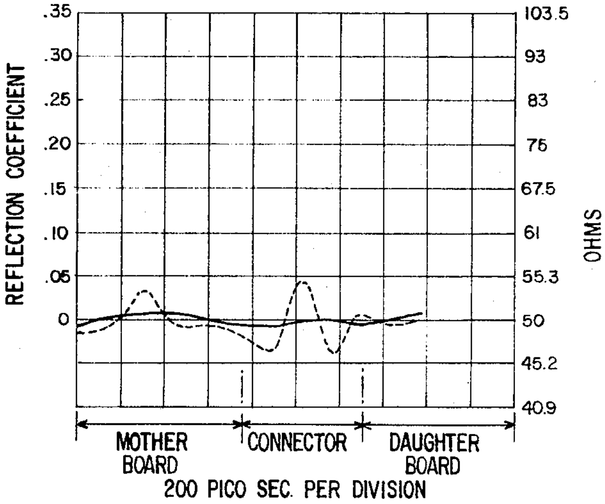
FIG. 2 is a time domain reflectometer plot for a printed circuit board to printed circuit board connection using a conventional printed circuit connector and the teachings of this invention.
Figure 5:
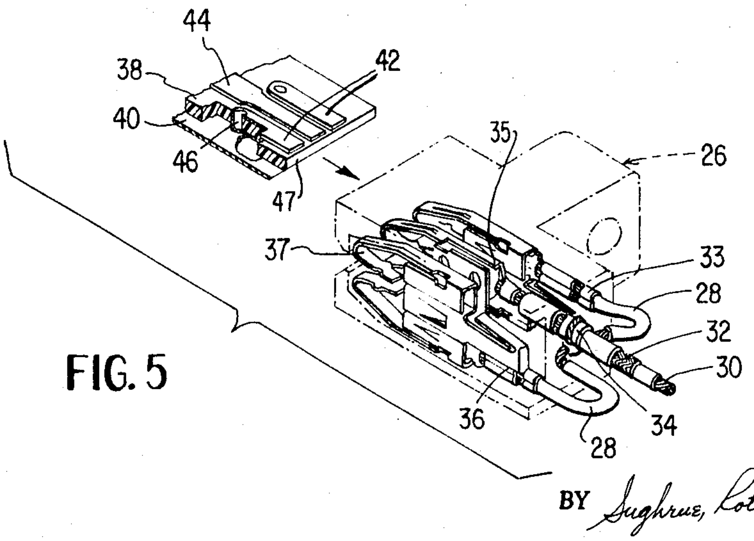
FIG. 5 shows a preferred embodiment of the invention wherein a coaxial cable is coupled to a printed circuit board with a standard printed circuit connector while optimizing impedance matching.

Another embodiment of the invention is shown in FIG. 5. This embodiment is used to obtain optimum matching when a coaxial cable is coupled to a printed circuit board. Again, a conventional printed circuit connector is used. Mounted in alternate holes of the dielectric body of the connector 26 are crimp terminated spring contacts 33 and 36. The coaxial cable is crimped to contact 35 positioned between the spring contacts 33 and 36 so that the signal carrying conductor 30 makes electrical contact with the top spring member 37 of this contact 35. The coaxial braid makes electrical contact with the coaxial contact body 34 which contains, as an integral part thereof, the lower spring member of contact 35. The coaxial braid is also connected to contact 33 by a wire 28, while the contact body 34 is connected through another wire 28 to contact 36.

Ground plane 40 is mounted on one side of printed circuit board 38. On the opposite side is mounted the two conductive pads 42 which are grounded through holes 46 to the ground plane 40. Between the conductive pads 42 is mounted the signal carrying conductor 44. As with the board-to-board connection, only one signal carrying conductor and one pair of conductive pads are shown. However, it is understood that additional pads and signal carrying conductors may be carried by the same board.

The board is coupled to the coaxial cable through connector 26 by engaging the front face 47 of the printed circuit board with the spring terminal ends 37 of the contacts. The conductive pads, as in the board-to-board connection, supply the needed capacitive impedance necessary for impedance matching.

The specific dimensions of the conductive pads will vary depending upon the board and connector to which the board is coupled. In every case, however, matching can be optimized simply by varying the dimensions of these conductive pads.

Since the optimization can be seen visually from the time domain reflectometer plots, it becomes a simple matter to impedance match the connections using conventional printed circuit connectors.

While the invention has been particularly shown and described with reference to the preferred embodiments thereof, it will be understood by those skilled in the art that various changes in form and details may be made therein without departing from the spirit and scope of the invention.

What is claimed is:

1. A printed circuit board comprising, a plane of dielectric material, a conductive layer formed on one surface of said dielectric plane, at least one signal conductor formed on the surface of the dielectric opposite the surface carrying said conductive layer and, impedance matching means, formed on said one surface adjacent to and insulated from said signal conductor and electrically connected to said conductive layer, for compensating for connector mismatch when said board is coupled to a connector.

2. The invention of claim 1 wherein;

said impedance matching means comprises at least one pair of conductive pads formed at at least one end of said board, whereby the coupling of said board to a connector causes said pads to be in electrical contact with at least one pair of contacts of said connector.

3. The invention of claim 2 wherein;

said signal carrying conductor is formed between said pair of conductive pads.

4. The combination comprising;

a first and second printed circuit board, each with a ground plane on one surface thereof and at least one signal conductor formed on another surface thereof, said another surface being in a parallel plane with said one surface, connector means connecting said first board to said second board and impedance matching means formed on said another surface of said second board, adjacent to and insulated from said signal conductor of said second board and electrically connected to said ground plane of said second board.

5. The combination of claim 4 wherein;

said impedance matching means comprises at least one pair of conductive pads formed on said another surface of said second board, said signal conductor of said second board being formed between said pair of pads.

6. The combination of claim 5 wherein;

said connector means includes a plurality of contacts, at least two of said contacts being electrically connected to said conductive pads of said second board and to said groundplane of said first board, and at least one other of said plurality of contacts positioned between said two contacts being electrically connected to said signal conductor of said first board and said signal conductor of said second board.

7. The combination comprising;

a printed circuit board with a ground plane formed on one surface thereof and at least one signal conductor formed on another surface of said board, said another surface being in a parallel plane with said one surface, a coaxial cable comprising a signal conductor, a shield conductor and a coaxial contact body, connector means connecting said coaxial cable to said printed circuit board and impedance matching means formed on said another surface of said board, adjacent to and insulated from said signal conductor, and electrically coupled to said ground plane.

8. The combination of claim 7 wherein;

said impedance matching means comprises at least one pair of conductive pads formed on said another surface, said signal conductor formed between said pair of pads.

9. The combination of claim 8 wherein;

said connector means includes at least three contacts for connecting said shield conductor and said coaxial contact body to said pair of conductive pads and said coaxial cable signal conductor to said board signal conductor.

* * * * *